United States Patent [19]
Morishita

[11] Patent Number: 5,140,400
[45] Date of Patent: Aug. 18, 1992

[54] SEMICONDUCTOR DEVICE AND PHOTOELECTRIC CONVERTING APPARATUS USING THE SAME

[75] Inventor: Masakazu Morishita, Atsugi, Japan

[73] Assignee: Canon Kabushiki Kaisha, Tokyo, Japan

[21] Appl. No.: 499,987

[22] Filed: Mar. 27, 1990

[30] Foreign Application Priority Data

Mar. 29, 1989 [JP] Japan .................. 1-77440

[51] Int. Cl.⁵ .................. H01L 29/72; H01L 29/161; H01L 29/205; H01L 29/225
[52] U.S. Cl. .................. 357/34; 357/16; 357/35; 357/30
[58] Field of Search .................. 357/30, 16, 34, 35

[56] References Cited

U.S. PATENT DOCUMENTS

| | | | |
|---|---|---|---|
| 3,242,018 | 3/1966 | Grabmaier | 148/180 |
| 4,160,258 | 7/1979 | Dawson et al. | 357/16 |
| 4,620,210 | 10/1986 | Scavennec et al. | 357/30 |
| 4,785,457 | 11/1988 | Asbeck et al. | 372/45 |
| 4,829,343 | 5/1989 | Levi | 357/4 |
| 4,899,200 | 2/1990 | Shur et al. | 357/30 |

FOREIGN PATENT DOCUMENTS

| | | | |
|---|---|---|---|
| 177246 | 9/1986 | European Pat. Off. | 29/72 |
| 1166938 | 4/1964 | Fed. Rep. of Germany | 29/165 |
| 62-58678 | 8/1987 | Japan | 29/72 |

OTHER PUBLICATIONS

H. Kroemer, *Japanese Journal of Applied Physics, Supplement*, "Heterostructures for Everything: Device Principles of the 1980's?", vol. 20, No. 20-1, pp. 9-13, 1980.
S. M. Sze, *Physics of Semiconductor Devices*, Wiley, New York, pp. 783-787, 1980.
*IBM Technical Disclosure Bulletin*, "Heterojunction Bipolar Transistor with Low Base Conductivity," vol. 28, No. 5, p. 2005, Oct. 1985.
Winstel and Weyrich, *Optoelektronik II*, Springer, Berlin, pp. 232-234, 1986.

*Primary Examiner*—Andrew J. James
*Assistant Examiner*—Stephen D. Meier
*Attorney, Agent, or Firm*—Fitzpatrick, Cella, Harper & Scinto

[57] ABSTRACT

This invention relates to a semiconductor device having a collector region of first conductivity type, a base region of second conductivity type, and an emitter region of first conductivity. The base region is divided into a first base area and a second base which surrounds the first base area forming a hereto-junction. The band gap of said second base area is greater than that of the first base area thereby preventing undesired diffusion current.

20 Claims, 15 Drawing Sheets

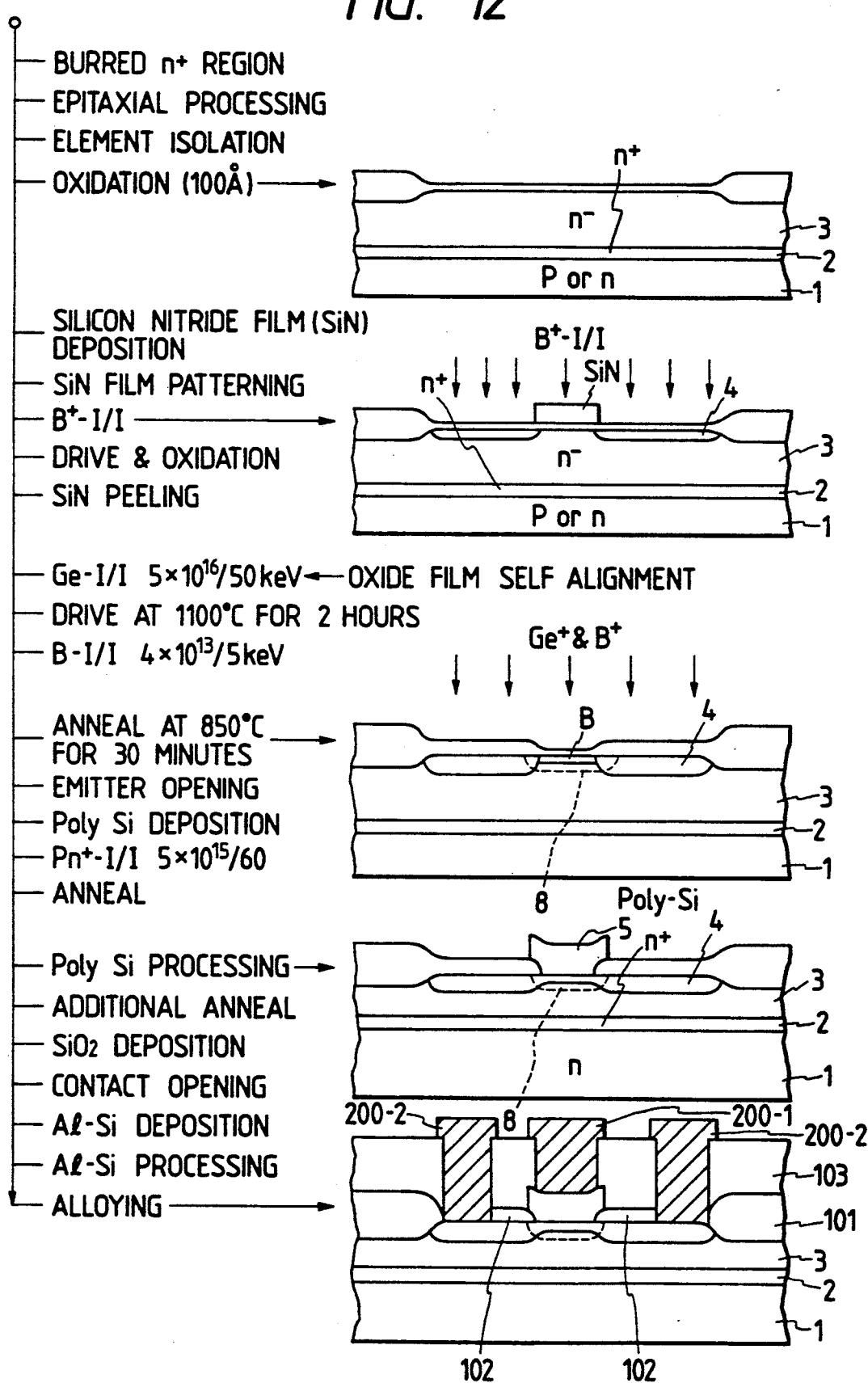

PLANE VIEW OF PHOTOELECTRIC CONVERSION DEVICE

X-X' SECTIONAL VIEW

Y-Y' SECTIONAL VIEW

SEMICONDUCTOR DEVICE AND PHOTOELECTRIC CONVERTING APPARATUS USING THE SAME

BACKGROUND OF THE INVENTION

1. Field of the Invention

The present invention relates to a semiconductor device and a photoelectric converting apparatus using the semiconductor device.

2. Related Background Art

As a conventional semiconductor device, an example of a bipolar transistor (hereinafter, referred to as a BPT) will be described. The BPT is mainly classified into a hetero bipolar transistor (hereinafter, referred to as an HBT) in which a semiconductor region of a wide gap is used for only an emitter and only the portion between the emitter and the base is constructed as a hetero junction and a double hetero BPT using a semiconductor region whose base has a narrower gap than that of the other emitter and collector. However, in both of them, the compositions in the horizontal direction of the base are constant.

FIG. 1 is a schematic cross sectional view showing an example of a conventional BPT. In the diagram, reference numeral 1 denotes a substrate (for instance, an Si semiconductor substrate); 2 indicates an n+ type buried region; 3 an n− region of a low impurity concentration; 4 a p region serving as a base region; 5 an n+ region serving as an emitter region; 6 a channel stop n+ region; 7 n+ region to reduce a collector resistance of a bipolar transistor; 101, 102, 103 and 104 insulative films to isolate elements, electrodes, and wirings, respectively; and 200 an electrode formed by metal, silicide, polycide, or the like.

The substrate 1 is formed as an n type by doping impurities of phosphorous (Ph), antimony (Sb), arsenic (As), or the like or as a p type by doping impurities of boron (B), aluminum (Al), gallium (Ga), or the like. The buried region 2 is not always necessary. The n− region 3 is formed by an epitaxial technique or the like. Boron (B), gallium (Ga), aluminum (Al), or the like and germanium (Ge) are doped in the base region 4. As an emitter region 5, polysilicon which was formed by a low pressure chemical vapor deposition (LPCVD) process or the like is used.

In such a conventional HBT, there is a problem such that when the HBT is made fine (is highly integrated), the peripheries of a current (current which is proportional to the emitter area) which flows from an emitter (E) to a collector (C) and an emitter current exert influences, so that a current flowing in the lateral direction (base horizontal direction) increases.

FIGS. 2 and 3 show examples of a conventional BPT and the current flowing in the lateral direction will be briefly explained.

In a schematic cross sectional view of FIG. 2, there is shown an HBT in which a semiconductor region of a wide gap (as compared with a band gap width of a semiconductor region to form a base and a collector) is used for only an emitter. In FIG. 2, reference numeral 201 denotes an n type semiconductor substrate serving as a collector region; 202 a p type semiconductor region serving as a based region; 203 an insulative layer; 204 an n+ type semiconductor region serving as an emitter region; and 205 an arrow which diagrammatically shows the flow of a current flowing in the BPT (particularly, in the base region) when the BPT shown in FIG. 2 is driven. As shown in FIG. 2, although the current flows in the vertical direction in FIG. 2, the current flow has an extent in the lateral direction in the base region.

A schematic cross sectional view of FIG. 3 shows an example in which a semiconductor of a narrow gap (a gap width narrower than a band gap width of a semiconductor region to form the collector and emitter) is used in the semiconductor region to form the base.

In FIG. 3, reference numeral 301 denotes an n+ type silicon region; 302 an n type silicon region serving as a collector region; 303 a p+ type silicon germanium ($Si_{1-x}Ge_x$) region serving as a base region; 304 an n type silicon region serving as an emitter region; 305 a p+ type silicon region to electrically connect the base region with an electrode 306; 307 an n+ type silicon region to electrically connect the emitter region with an electrode 308; 309 an arrow diagrammatically showing the flow of a current which flows when a double hetero BPT shown in FIG. 3 was driven; and 310 an insulative layer.

As shown in FIG. 3, although the current flows in the vertical direction in FIG. 3, the current flow has an extent in the lateral direction in the base region.

That is, the carriers which were implanted from the emitter region are not effectively shut out and a one-dimensional reduction of a current amplification factor occurs.

That is, a current amplification factor $h_{FE}$ of the HBT by an inherent current in the vertical direction which flows between the emitter and collector decreases. A similar problem occurs even in the BPT of the homo junction.

When an emitter area is large, a change in dimensions of the emitter area does not substantially exert any influence on the $h_{FE}$. However, when the emitter area is made fine, a change in area appears as a change in $h_{FE}$ of the HBT due to the effect of the peripheral length. In the case of the HBT, when $h_{FE}$ decreases, an amount of carriers which are implanted into the emitter region suddenly decreases and the recombination current in the base becomes the dominant term of $I_B$. Therefore, an increase in current in the lateral direction is extremely important.

In a photoelectric converting apparatus, when $h_{FE}$ decreases, a readout gain from the sensor using the BPT first decreases and a signal voltage drops. That is, this is because the current driving capability of the BPT deteriorates. Then, fixed pattern noises (FPN) increase. Therefore, the signal to noise (S/N) ratio which is most significant in the photoelectric converting apparatus remarkably deteriorates. On the other hand, since the current driving capability of the BPT deteriorates due to a decrease in $h_{FE}$, the switching speed and the response speed deteriorate.

Since an influence by the dimensions in the case where the area is made fine appears in $h_{FE}$, a variation in $h_{FE}$ when the sensor element was made fine in correspondence to the high density remarkably increases the photoelectric conversion noises, so that a variation in sensor elements increases and the sensor cannot be used. That is, an aperture ratio of the sensor also decreases, the signal decreases, a variation increases, and the S/N ratio remarkably deteriorates.

SUMMARY OF THE INVENTION

The present invention intends to solve the above problems. It is an object of the invention to provide a semiconductor device in which a diffusion current in the lateral direction in a base can be blocked and a collector current in the lateral direction can be substantially eliminated and also to provide a photoelectric converting apparatus using the semiconductor device.

Another object of the invention is to provide a semiconductor device which can eliminate the BPT function in the lateral direction and also to provide a photoelectric converting apparatus using the semiconductor device.

Still another object of the invention is to provide a semiconductor device in which an implantation current in the lateral direction can be suppressed and a base current can be reduced and also to provide a photoelectric converting apparatus using the semiconductor device.

Further another object of the invention is to provide a semiconductor device in which a current amplification factor $h_{FE}$ can be improved and the deterioration in $h_{FE}$ can be also prevented even in a fine HBT and also to provide a photoelectric converting apparatus using the semiconductor device.

Further another object of the invention is to provide a semiconductor device in which since a current in the lateral direction can be reduced, a current concentration at the emitter edge in a large current can be reduced and also to provide a photoelectric converting apparatus using the semiconductor device.

Further another object of the invention is to provide a semiconductor device in which a collector current can be shut out (unnecessary diffusion of a current in the lateral direction can be prevented) due to a difference between a band gap in the lateral direction and a band gap in the vertical direction and even if the device is made fine, a high current amplification factor is obtained and also to provide a photoelectric converting apparatus using the semiconductor device.

Further another object of the invention is to provide a semiconductor device of a high performance in which a current driving capability can be increased in the case of forming an emitter of the same pattern (size) as the conventional one and also to provide a photoelectric converting apparatus using the semiconductor device.

Further object of the invention is to provide a photoelectric converting apparatus in which a sensitivity is further raised by using a BPT structure of a high performance.

Still further object of the present invention is to provide a semiconductor device comprising a collector region of first conductivity type, a base region of record conductivity type, and an emitter region of first conductivity, wherein said base region has first base area and second base area provided around the first base area, and band gap width of said second base area is greater than that of said first base area.

Still further object of the present invention is to provide a semiconductor device comprising a collector region of first conductivity type, a base region of second conductivity type laminated on said collector region, and an emitter region of first conductivity type formed on said base region, wherein at least a portion of the base region under the emitter region has a band gap smaller than that of the emitter and collector regions, and the base region has horizontal potential barrier.

Still further object of the present invention is to provide a photoelectric conversion apparatus comprising an image pick-up unit having a semiconductor device comprising a collector region of first conductivity type, a base region of second conductivity type, and an emitter region of first conductivity type, wherein said base region has first base area and second base area around the first base area, and the second base area has a band gap greater than that of the first base area; vertical and horizontal scanning units relating to said image pick-up unit; and a reading unit.

Still further object of the present invention is to provide a photoelectric conversion apparatus comprising: an image pick-up unit having a semiconductor device comprising a collector region of first conductivity type, a base region of second conductivity type laminated on said collector region, an emitter region of first conductivity type, wherein at least a portion of said have region under said emitter region has a band gap no more than that of said emitter region and said collector region, and said base region has a horizontal potential barrier; vertical and horizontal scanning units relating to said image pickup unit; and reading unit.

BRIEF DESCRIPTION OF THE DRAWINGS.

FIG. 12 shows schematically process steps for producing the semiconductor device of the present invention;

DETAILED DESCRIPTION OF THE PREFERRED EMBODIMENTS

An example of a semiconductor device according to the present invention to accomplish the above object will be described hereinbelow.

The semiconductor device of the invention has a construction in which carriers implanted from an emitter are effectively shut out into a base region, thereby substantially blocking an extent of a current in the lateral direction.

That is, by providing a hetero junction into the base region, the diffusion in the unnecessary direction of the current is prevented by using a band gap barrier.

Almost of the base current in the hetero bipolar transistor (HBT) is caused by the recombination of the carriers which were implanted from the emitter, so that the shut-out of the base current provides a large effect.

Embodiments of the present invention will be described in detail hereinbelow with reference to the drawings.

(Embodiment 1)

Figure 1:
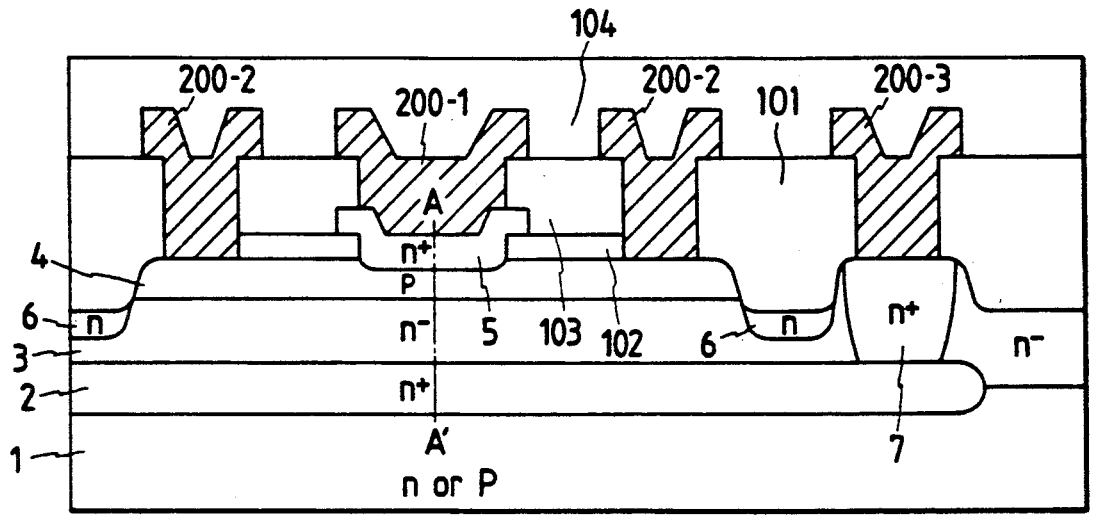
FIGS. 1-3 are schematic sectional views showing conventional bipolar transistor (BPT)
Figure 2:
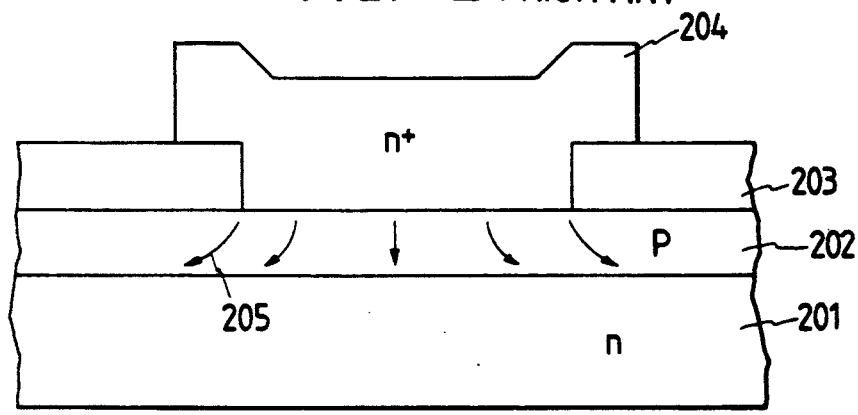
Figure 3:
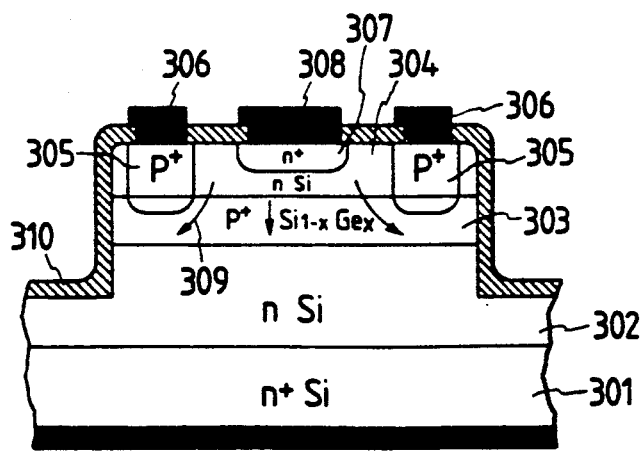
Figure 4:
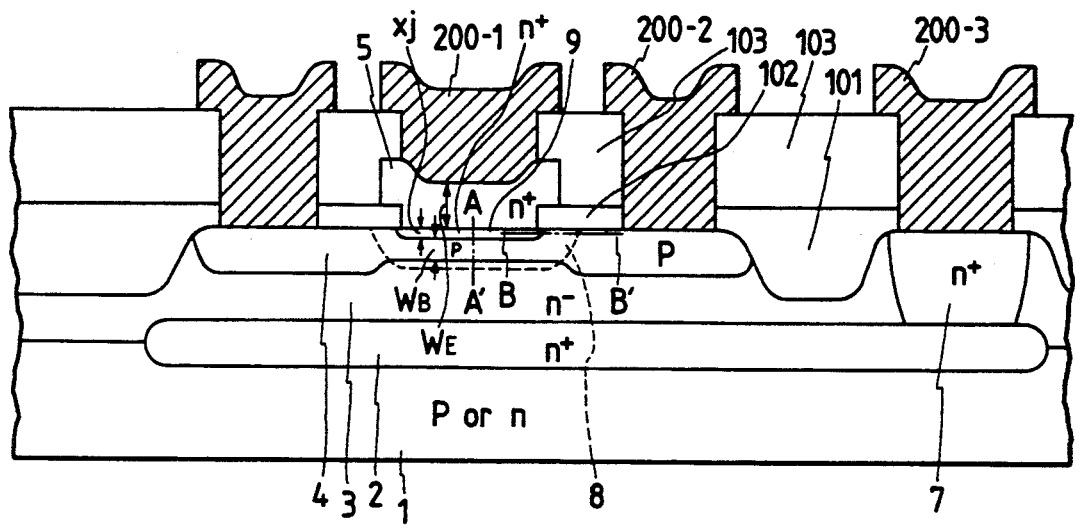
FIG. 4 is a schematic sectional view of a preferred embodiment of the present invention.

FIG. 4 is a diagram showing a semiconductor device according to an embodiment of the invention. In the diagram, the same parts and components as those shown in FIG. 1 are designated by the same reference numerals. Reference numeral 8 denotes a region of a mixed crystal $Si_{1-x}Ge_x$ which is formed by mixing Ge into Si. Reference numeral 9 indicates an emitter electrode made of polysilicon which is formed by a low pressure chemical vapor deposition (LPCVD) or the like or a monocrystalline silicon which is formed by an epitaxial technique or the like. The emitter electrode 9 corresponds to the n+ region having an impurity concentration of $1 \times 10^{17}$ to $1 \times 10^{21}$ cm$^{-3}$.

Figure 5:
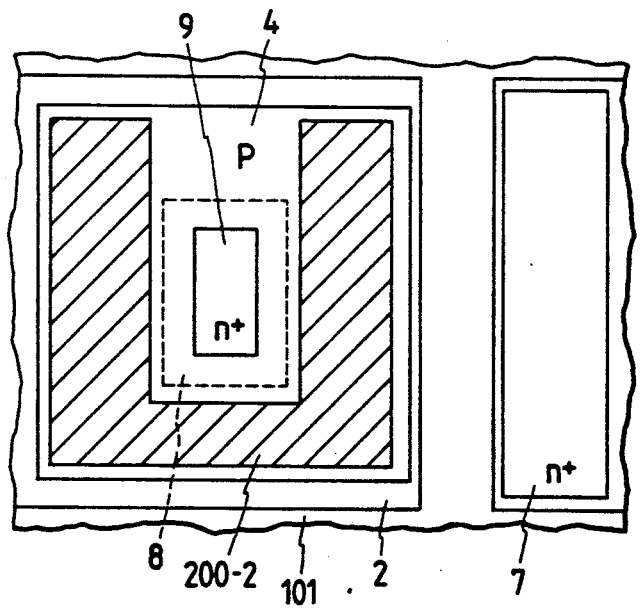
FIG. 5 is a schematic plan view of BPT shown in FIG. 4.

FIG. 5 shows a schematic plan view for explaining an arrangement relation among the regions of a base, an emitter, and a collector of the semiconductor device shown in FIG. 4. Reference numerals shown in FIG. 5 correspond to those in FIG. 4.

As shown in FIG. 5, the $Si_{1-x}Ge_x$ region 8 is formed in the p region 4 of the base region so as to be surrounded like a plane. The n+ region 5 (not shown) is provided onto the emitter electrode 9. Further, an electrode 200-1 (not shown) is provided. The base region is formed by the $Si_{1-x}Ge_x$ region 8 and the p region 4. That is, the device has a structure in which a hetero junction is formed in the base. An electrode 200-2 is formed on the p region 4 so as to be electrically connected therewith. (In this case, the electrode 200-2 is formed in a U-shape.) The n+ region 7 is formed at a position away from the base region. An electrode (collector electrode 200-3) is formed on the n+ region 7. A collector electrode 200-3 is also similarly formed.

In the semiconductor device of the embodiment as mentioned above, the base current mainly comprises the following two components. (In the case where the edge of $W_E$ of the emitter is come into contact by metal)

The main current components of the base current are $J_{Binj}$ and $J_{Brec}$.

Base current mainly comprises $J_{Binj}$ and $J_{Brec}$.

First, a diffusion current ($J_B = J_{Binj} + J_{Brec}$) of the holes from the base to the emitter is approximately expressed by $$J_{Binj} = (q \cdot n_i^2 \cdot D_p/N_E \cdot L_p) \times \text{coth}(W_E/L_P)[\exp(V_{BE}/kT) - 1] \quad 1\text{-}(1)$$

since a potential barrier exists. On the other hand, a recombination current of the electrons which were implanted from the emitter is expressed by $$J_{Brec} = \{q \cdot n_i^2 \cdot D_n \exp(\Delta E_g/kT)/N_B \cdot L_n\} \times \quad 1\text{-}(2)$$
$$[\{\cosh(W_B/L_N) - 1\}/\{\sinh(W_B/L_N)\}] \times [\exp(V_{BE}/kT) - 1]$$

On the other hand, a collector current is expressed by $$J_C = \{q \cdot n_i^2 \cdot D_n \exp(\Delta E_g/kT)/N_B \cdot L_n\} \times \quad 1\text{-}(3)$$
$$\{\text{cosech}(W_B/L_N)\} \times \{\exp(V_{BE}/kT) - 1\}$$

q denotes charges; $n_i$ indicates an intrinsic semiconductor charge concentration (Si); $N_E$ an impurity concentration of the emitter; $N_B$ an impurity concentration of the base; $D_P$ a diffusion coefficient of the holes; $D_N$ a diffusion coefficient of the electrons; $L_P$ a diffusion length ($\approx (D_P \tau_P)^{\frac{1}{2}}$) of the holes; $L_N$ a diffusion length ($\approx D_N \tau_N)^{\frac{1}{2}}$ of the electrons; k a Boltzmann's constant; T an absolute temperature; $V_{BE}$ a base-emitter forward bias voltage; $\tau_P$ and $\tau_N$ minority carrier lives of the holes and electrons; $\Delta E_g$ a band gap difference between Si and Si-Ge; $W_E$ a thickness of emitter; and $W_B$ a thickness of base.

In the region formed by Si, an amount of intrinsic carriers in the base is equal to $n_i^2$. In the region formed by Si-Ge, it is equal to $n_i^2 \exp(\Delta E_g/kT)$. This is because the band gap of the base is narrower than that of the emitter by only $\Delta E_g$.

Therefore, in the HBT according to the embodiment, the collector current increases and the recombination current of the carriers which were implanted from the emitter also increases. On the contrary, the number of carriers which are implanted from the base into the emitter decreases, so that the current amplification factor $h_{FE}$ increases.

Figure 6A:
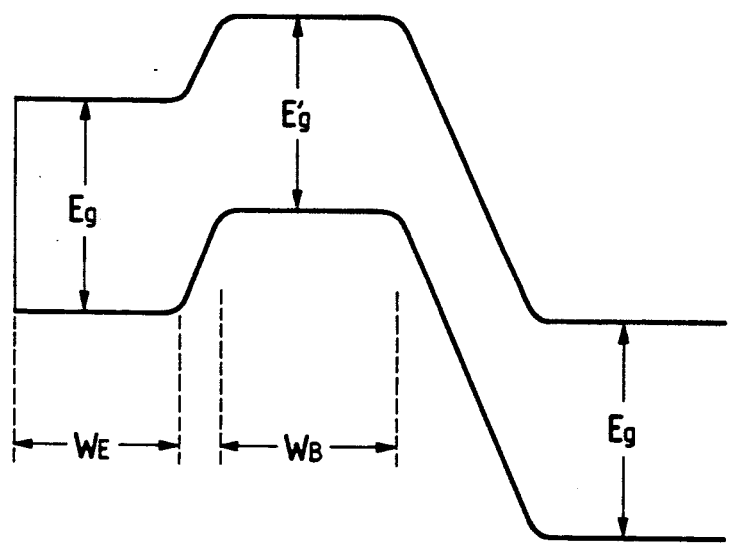
FIGS. 6A and 6B are potential diagrams along A—A', and B—B' in FIG. 4.
Figure 6B:
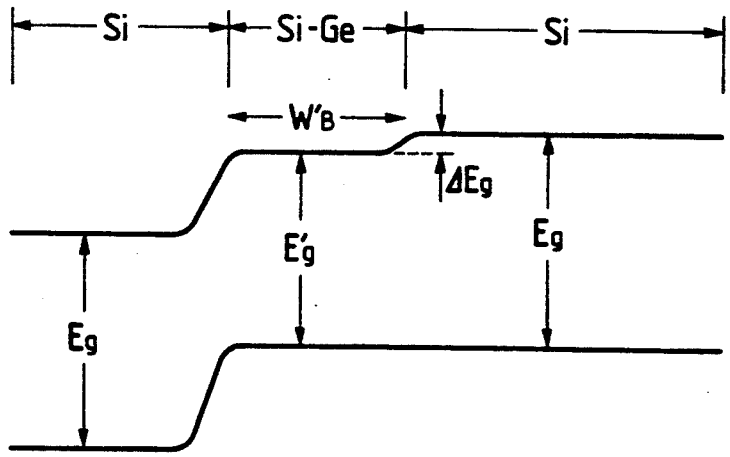

FIGS. 6A and 6B are potential diagrams at lines A—A' and B—B' shown in FIG. 4. In the diagrams, $E_g$ denotes a band gap of Si and $E_g'$ indicates a band gap of Si-Ge. As shown in the diagrams, $\Delta E_g = E_g - E_g'$.

It is a feature of the invention that as shown in FIG. 6B, a potential barrier $\Delta E_g$ is formed in the base in the lateral direction. The carriers which are implanted are blocked by the potential barrier. A possibility such that the potential exceeds the potential barrier is set to $\exp(-E_g/kT)$. For instance, when $\Delta E_g = 0.1$, the possibility is set to about 1/54. Therefore, the current in the lateral direction can be suppressed and the collector current can be allowed to efficiently flow in the vertical direction.

In the homo junction BPT, the base current $J_{Binj}$ of the carriers which are implanted from the base to the emitter is ordinarily larger than the recombination current $J_{Brec}$ of the carriers which were implanted from the emitter. The current $J_{Binj}$ is a main factor of the base current. However, in the HBT, as shown in the equation (2), $J_{Brec}$ is $\exp(\Delta E_g/kT)$ times as large as that in the case of $J_{Binj}$, so that $J_{Brec} > J_{Binj}$. For instance, assuming that $\Delta E_g \approx 0.1$ eV, kT = 0.025 eV at an ordinary temperature, so that $\exp(\Delta E_g/kT) \approx 54$. If $\Delta E_g$ has an enough value, $J_{Brec} >> J_{Binj}$. The base current almost comprises $J_{Brec}$ and the current amplification factor $h_{FE} = J_C/J_{Brec}$.

Now, assuming that $W_B << L_n$, the following equation is obtained.

$$h_{FE} = (2L_n/W_B)^2 \quad (4)$$

The above value is a limit value of $h_{FE}$ of the HBT. That is, the value of $h_{FE}$ is determined by only the thickness $W_B$ of the neutral region of the base and the diffusion length $L_n$ of the minority carriers which are diffused in the base.

Figure 7:
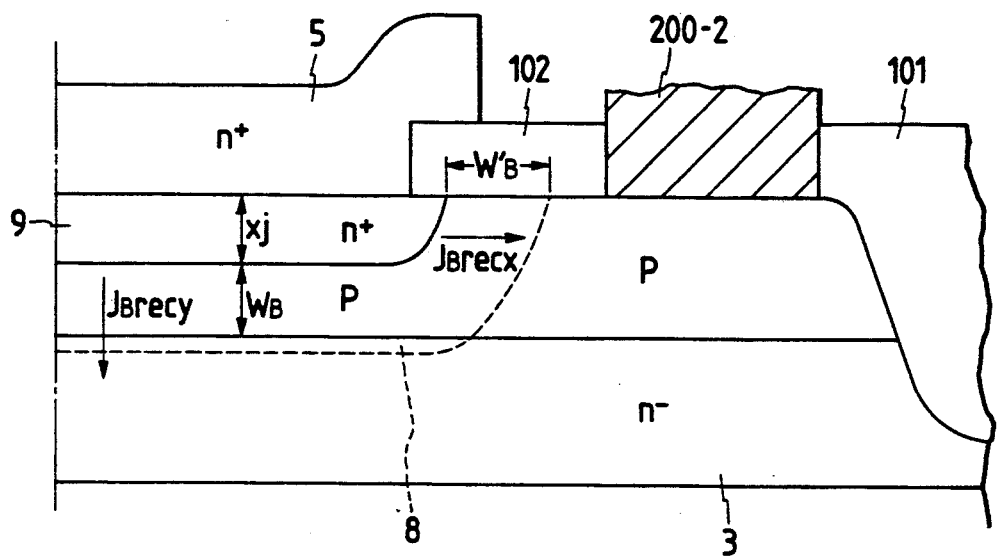
FIG. 7 is an enlarged schematic sectional view of an emitter portion of BPT.

Although the above case relates to the one-dimensional HBT approximation, actually, the current two-dimensionally (on the cross sectional diagram) flows. FIG. 7 is a diagram in which only the emitter portion is enlarged. In the diagram, $X_j$ denotes a depth of emitter in the substrate, $W_B$ a base width in the vertical direction, and $W_B'$ a distance until the potential barrier shown in FIG. 6B. As shown in FIG. 7, the base current $J_{Brec}$ can be mainly divided into the inherent $J_{Brecy}$ component flowing in the vertical direction and the $J_{Brecx}$ component flowing in the lateral direction. In this case, $J_{Brecx}$ reduces the $h_{FE}$ of the HBT.

If approximation is made such that the carriers are completely blocked by the potential barrier shown in FIG. 6B, $J_{Bx}$ is expressed as follows.

$$J_{Bx} = \{q \cdot n_i^2 \cdot D_n \exp(\Delta E_g/kT)/N_B \cdot L_n\} \times \tanh(W_B'/L_N)\{\exp(V_{BE}/kT) - 1\} \quad (5)$$

When considering the current term, assuming that an emitter area is set to $A_E$ and an emitter peripheral length is set to $L_E$, $h_{FE}$ is expressed as follows.

$$h_{FE} = A_E J_c/(A_E J_{By} + L_E X_j J_{Bx}) \quad (6)$$

When the peripheral length does not inherently cause any problem, $h_{FE}$ is determined by $h_{FE} = J_c/J_{By}$. However, when the device is made fine, $A_E$ and $L_E X_j$ become almost equal. For example, assuming that $X_j = 0.3$ μm and $A_E = 1 \times 1$ μm$^2$, $X_j L_E/A_E = 1.2$. When the device is made fine, $J_{Bx}$ exerts a very large influence on $h_{FE}$.

When the ratio of $J_{By}$ shown by the equation (2) and $J_{Bx}$ shown by the equation (5) is approximated by the conditions of $L_n \gg W_B$ and $L_n \gg W_B'$, $$J_{Bx}/J_{By} \approx 2 W_B'/W_B \quad (7)$$

The current concentration in the lateral direction is larger than the current concentration in the vertical direction. In the case of the conventional BPT having no potential barrier, the equation (5) can be directly applied, so that $J_{Bx}/J_{By} \approx 2 (L_n W_B)$. Generally, since $L_n \gg W_B$, the current concentration in the lateral direction increases. In this state, as shown in the equation (6), $h_{FE}$ inevitably deteriorates.

As shown in the embodiment, when a potential barrier in the lateral direction of the invention is made and the emitter area is set such that $A_E = L_{Ex}^2$ and the equations (6) and (7) are used, $h_{FE}$ is expressed by the following equation.

$$h_{FE} = (J_c/J_{By})[1/\{1 + (8X_j/L_{Ex})(W_B'/W_B)\}] \quad (8)$$
$$= h_{FEO}[1/\{1 + (8X_j/L_{Ex})(W_B'/W_B)\}]$$

That is, the value of $h_{FE}$ in this case is fairly smaller than $h_{FEO}$ which is determined by the BPT structure in the vertical direction. To reduce the influence by the current in the lateral direction, the following condition must be satisfied.

$$(8X_j/L_{Ex})(W_B'/W_B) \leq 1 \quad (9)$$

For instance, when $W_B' = W_B$ and $L_{Ex} = L_{nm}$, $X_j \leq 0.125$ μm. This influence causes a very large problem when the emitter size is very fine. In the case of the conventional BPT having no potential barrier, since $W_B'$ is replaced by $L_n$, $h_{FE}$ cannot be increased and the feature of the HBT cannot be effectively used. According to the invention, since the device can be manufactured so as to satisfy the condition of $W_B' \leq W_B$, if the depth $X_j$ of emitter is determined in accordance with the emitter area, the decrease in $h_{FE}$ can be suppressed.

Figure 8:
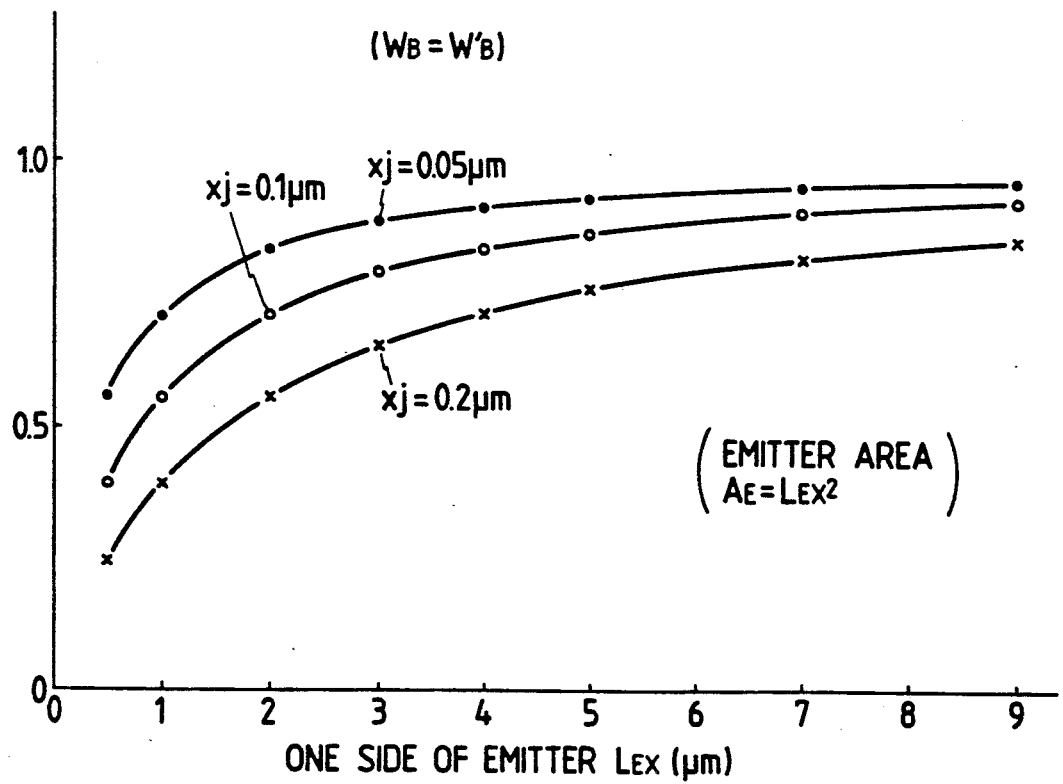
FIG. 8 is a graph showing relation of $h_{FE}/h_{FEO}$.

FIG. 8 is a graph showing the relation between a length $L_{EX}$ (μm) of one side of the emitter and the standardized value of $h_{FE}/h_{FEO}$ with respect to the cases where $W_B = W_B'$ and $X_j = 0.05$ μm, 0.1 μm, and 0.2 μm by using the equation (8). From FIG. 8, it will be appreciated that in the fine BPT in which the emitter is formed by a square of 3 μm or less, the condition of about $X_j \leq 0.1$ μm is needed under the condition of $W_B' = W_B$.

Ordinarily, in the case where the hetero semiconductor region 8 is formed by the diffusion, $W_B' = W_B$. When it is formed by the ion implantation, $W_B' \leq W_B$. However, $W_B'$ is not set to a value of about ¼ of $W_B$. The relation between $W_B'$ and $W_B$ can be variably determined by the conditions of the processes.

The mixed crystal of Si and Ge will now be described in detail. Si and Ge have the same diamond type crystal and are complete solid solutions. They become complete diamond type crystal with respect to all of x ($0 < x < 1$) of $Si_{1-x}Ge_x$.

Figure 9:
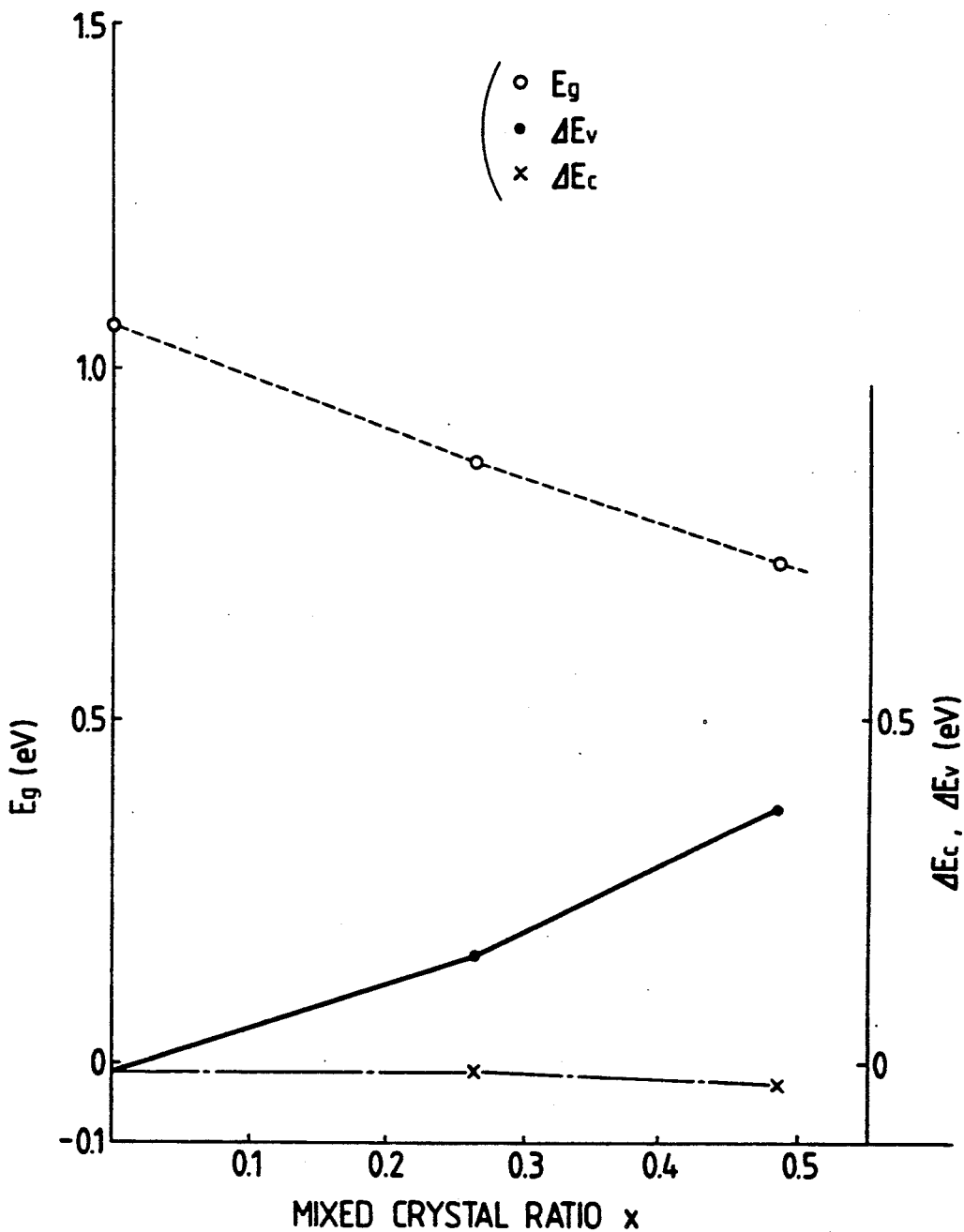
FIG. 9 shows an energy gap relative to mixed crystal ratio of Si and Ge.

The band gap $E_g$ of Si is approximately 1.1 eV and that of Ge is approximately 0.7 eV. $E_g$ changes as shown in FIG. 9 with an increase in x. In FIG. 9, an axis of abscissa denotes a mixed crystal ratio x and an axis of ordinate indicates a band gap $E_g$, a reduction width $\Delta E_c$ on the conduction band side, and a reduction width $\Delta E_v$ on the valence band side. In the mixed crystal of $Si_{1-x}Ge_x$, the reduction in band gap occurs in almost of the valence band. Thus, the implantation of the holes into the emitter can be suppressed and such a mixed crystal does not become a barrier when the electrons are implanted from the emitter to the base. Therefore, such a structure is very excellent for the HBT.

Another problem in the hetero junction relates to a difference of lattice constants in materials. The lattice constant of Si is $d_{Si} = 5.43086$ Å and the lattice constant of Ge is $d_{Ge} = 5.65748$ Å. Therefore, the difference between those lattice constants is about 4%. Accordingly, when $Si_{1-x}Ge_x$ is formed on Si, a stress obviously occurs and in the remarkable case, a dislocation occurs.

Figure 10:
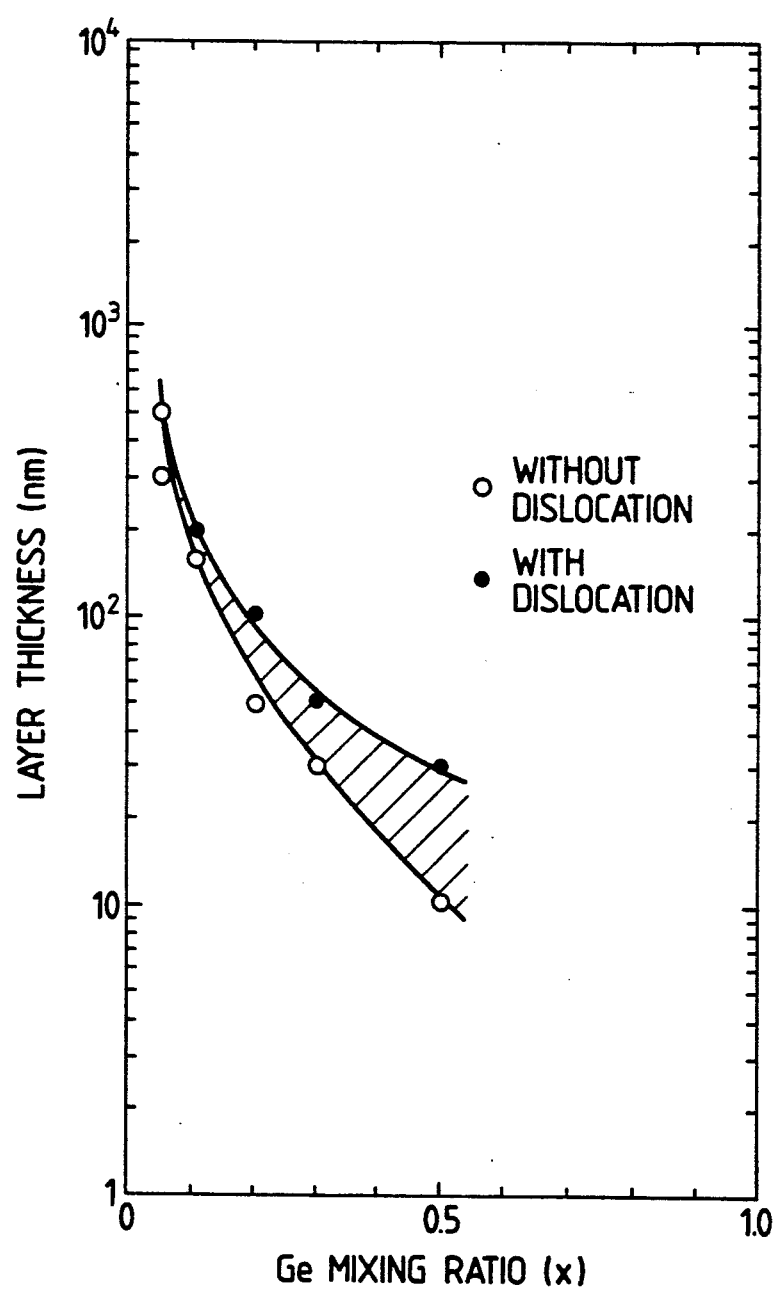
FIG. 10 shows a mixed crystal ratio and a transition of Si and Ge.

There is a predetermined relation between the mixed crystal ratio x of Ge and the thickness at which no dislocation occurs. FIG. 10 is a diagram showing such a relation. An axis of abscissa denotes the mixed crystal ratio x of $Si_{1-x}Ge_x$ and an axis of ordinate indicates the relation between the presence of the dislocation (● mark) and the absence of the dislocation (* mark). Those data were obtained as the result of the examination in the case where $Si_{1-x}Ge_x$ was deposited onto the Si substrate by the molecular beam epitaxial (MBE) method. In this case, since the mixed crystal was grown at 510° C., a thickness of transition region from $Si_{1-x}Ge_x$ to Si is very thin. In the case where $Si_{1-x}Ge_x$ was formed by the MBE method, Si and $Si_{1-x}Ge_x$ change step by step. Therefore, in the layer of uniform mixed crystal composition x, if the thickness of such a region is not a thickness of the hatched region in FIG. 10 or less, a dislocation occurs at an interface.

According to the invention, the problem of the dislocation is solved by forming a stairway inclined hetero junction for the above region. By ion implanting Ge into the base, the inclined hetero junction is accomplished.

In the conventional stairway hetero junction BPT of $Si_{1-x}Ge_x$, there are a lot of stresses and in the remarkable case, the dislocation occurs and many recombination centers are generated at the interface between $Si_{1-x}Ge_x$ and Si. Thus, an excess current flows, $I_B$ increases on the low current side, $h_{FE}$ is small in the region of a micro $I_c$, and as $I_c$ increases, $h_{FE}$ rises.

Figure 11:
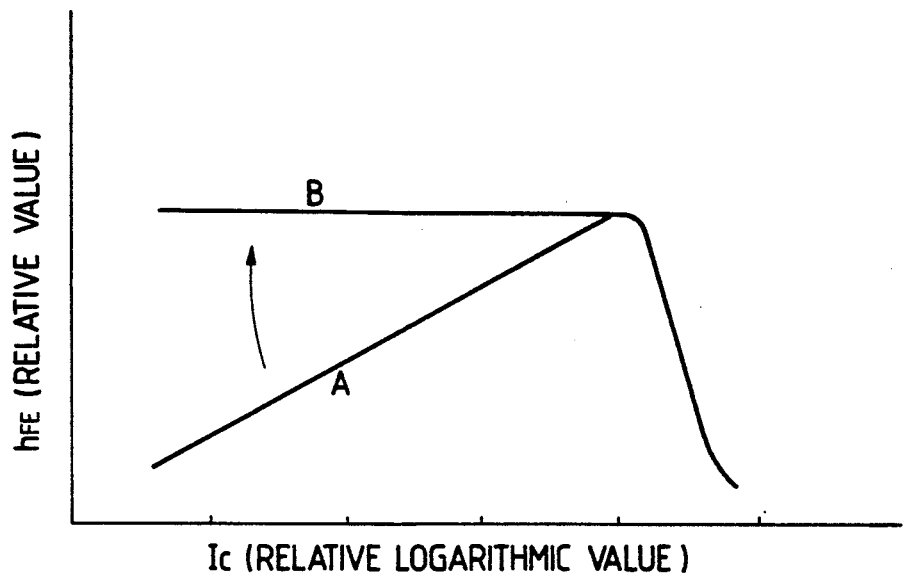
FIG. 11 shows $h_{FE}$ of properties BPT according to a conventional art and the present invention.

On the other hand, according to the embodiment, at the hetero interface, a transition gradually occurs from $Si_{1-x}Ge_x$ to Si. Different from the conventional method by the MBE or the like, the ion implantation method is used. Therefore, the hetero junction which is closer to the ideal state was obtained. FIG. 11 is a graph for comparing the $h_{FE}$ characteristics between the conventional BPT and the BPT according to the embodiment. In the graph, an axis of abscissa denotes the collector current and an axis of ordinate indicates the current amplification factor $h_{FE}$ ($=J_c/J_B$). A indicates the conventional $h_{FE}$ characteristics and B denotes the $h_{FE}$ characteristics of the embodiment.

It is sufficient to decide a thickness of transition region by using a value which is obtained from FIG. 10. For instance, when the mixed crystal ratio $x=0.3$, it is sufficient that a width of peak concentration is set to 300 Å or less. When $X=0.2$, it is sufficient that the width of peak concentration is set to 500 Å or less. When $x=0.1$, it is sufficient that the width of peak concentration is set to 1500 Å or less. The ion implantation conditions can be easily determined by analyzing the impurity distribution of the ion implantation by, for instance, an SIMS (secondary ion mass spectrograph). The thickness (ion implantation conditions) of the transition region of the hetero junction can be determined in accordance with the data of FIG. 10 by comparing with the result of the SIMS analysis in accordance with the design mixed crystal ratio x.

The mixed crystal ratio x can be easily calculated by a dose amount of Ge since the value of x of Si is almost equal to $5\times 10^{22}$ cm$^{-3}$.

FIG. 12 shows an example of a schematic manufacturing processing flow of the semiconductor device shown in FIG. 4. The important process relates to the step of selectively introducing Ge to only the region under the emitter. In FIG. 12, Ge ions are implanted (*impurity concentration*$=5\times 10^{16}$ cm$^{-2}$, mixed crystal ratio$\approx 0.1$) into only the portion in which an emitter opening will be formed by self alignment by an oxide film. The Ge ions are diffused until a predetermined depth. After that, B+ ions ($4\times 10^{13}$ cm$^{-2}$) as a base are implanted at a low accelerating voltage of 5 keV. Then, the heat treatment is executed at 850° C. for 30 minutes and a depth of base is decided. The other steps are executed as shown in FIG. 12. The $Si_{1-x}Ge_x$ region can be also formed in a manner such that after the emitter opening was formed, the shallow etching is performed to the substrate and, thereafter, $Si_{1-x}Ge_x$ is epitaxially grown.

In the case of forming $Si_{1-x}Ge_x$ by the epitaxial method, it can be set such that $W_B' < W_B$. However, in this case, since a stairway hetero junction is made, it is desirable to form in consideration of the stresses, dislocation, defects, and the like.

(Embodiment 2)

Figure 13:
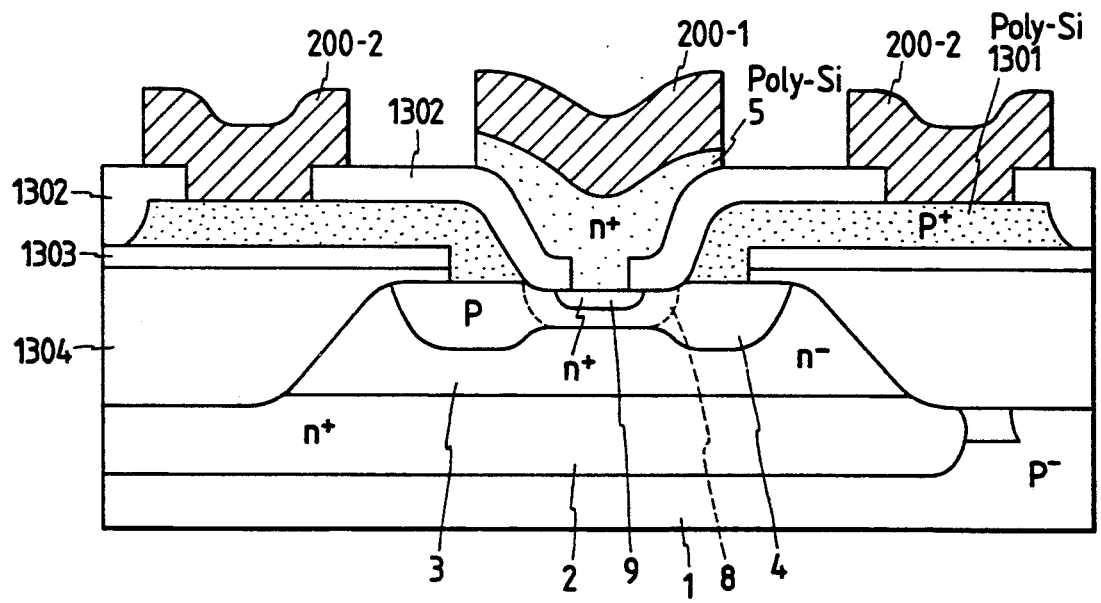
FIGS. 13 and 14 are schematic sectional views of another embodiment of the present invention.

FIG. 13 is a schematic cross sectional view showing another embodiment of the invention.

In FIG. 13, the same parts and components as those shown in FIG. 4 are designated by the same reference numerals. In FIG. 13, reference numeral 1301 denotes a p+ region made of polysilicon to electrically connect the p region 4 of the base region with the electrode 200-2. Reference numerals 1302, 1303, and 1304 denote insulative layers of $SiO_2$ or the like.

In the embodiment, the extracting electrode of the base is made of p+ polysilicon and the essential base and emitter are made by the self alignment.

Even in the above BPT, the characteristics of the current amplification factor $h_{FE}$ can be remarkably improved.

(Embodiment 3)

Figure 14:
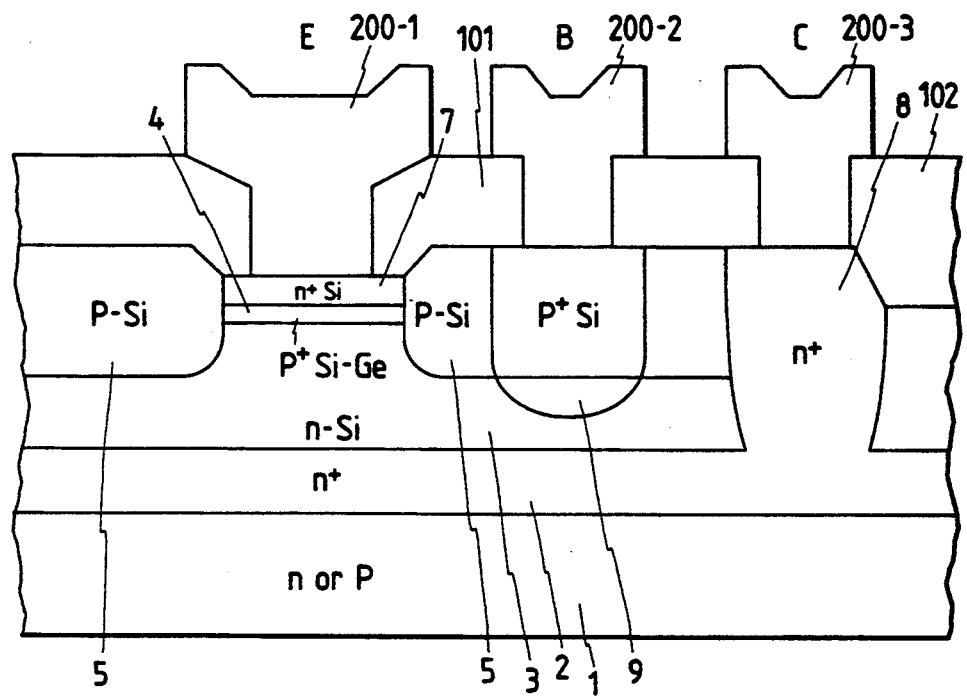

FIG. 14 is a schematic cross sectional view for explaining further another embodiment of the invention.

In FIG. 14, reference numeral 1 denotes the n or p type semiconductor substrate; 2 indicates the buried region in which a material (impurities) which dominates the conductivity to the n type was doped; 3 the n region in which n type impurities were doped; 4 the p type intrinsic base region (the first base region) as a semiconductor region of a narrow band gap of a semiconductor which constructs a hetero bipolar; 5 the external base region (the second base region) formed in the outer periphery of the intrinsic base region 4; 9 the p+ region to reduce the base resistance and/or base contact resistance; 7 the n+ region (the emitter region) as an emitter region formed by a semiconductor having a wider band gap than that of the semiconductor which forms the first base region; 8 the n+ region to reduce the collector resistance of the bipolar transistor; 101 and 102 insulative films to electrically isolate the transistors, electrodes, wirings, and the like; and 200-1, 200-2, and 200-3 the emitter electrode, base electrode, and collector electrode which are made of metal, silicide, polycide, or the like, respectively.

Generally, as the semiconductor substrate 1, there is used an n type silicon substrate in which an atom which is selected from the group V in the periodic table such as phosphorus (P), arsenic (As), antimony (Sb), or the like is doped as impurities or there is used a p type silicon substrate in which an atom which is selected from the group III in the periodic table such as boron (B), aluminum (Al), gallium (Ga), or the like is doped as impurities.

The buried region 2 includes n type impurities at a concentration of $10^{16}$ to $10^{20}$ cm$^{-3}$.

The n region 3 (serving as a collector region of the BPT) is formed by the epitaxial technique or the like and contains n type impurities at a low impurity concentration of about $10^{14}$ to $10^{17}$ cm$^{-3}$.

The first base region 4 is a semiconductor region containing Si and Ge and includes p type impurities at a concentration of $10^{16}$ to $10^{20}$ cm$^{-3}$.

The second base region 5 is made of monocrystalline Si by the vapor phase deposition or the like.

The constituting components of the current of the BPT will now be described with respect to the example of the embodiment.

The current which is supplied from the emitter can be approximated as follows in the first base region.

$$J_{Ej} \frac{qD_n n_i^2 e^{\frac{\Delta E_g}{kT}}}{N_B \cdot W_B} \left\{ \exp\left(\frac{V_{BE}}{kT}\right) - 1 \right\} \quad 2\text{-(1)}$$

It is assumed that a diffusion length $L_n$ of the electrons is sufficiently longer than a base width $W_B$. $N_B$ denotes a base concentration; $D_n$ a diffusion distance of the electrons; $n_i$ an intrinsic carrier concentration of Si; and $V_{BE}$ a base-emitter applied voltage.

$\Delta E_g$ denotes a difference between the band gaps of Si-Ge and Si.

As current components which two-dimensionally flow in the lateral direction in the periphery of the emitter, there is a relation of $L_n < W_B$, so that they can be approximated as follows.

$$J_{Ee} = \frac{qD_n n_i^2}{N_B \cdot L_n} \left\{ \exp\left(\frac{V_{BE}}{kT}\right) - 1 \right\} \quad 2\text{-}(2)$$

The Si-Ge mixed crystal and Si are approximated by regarding that they are the same as those of $D_n$, $N_B$, and the like. The current ratio $P_E$ exerts an influence on the characteristics of the BPT. Assuming that the emitter area is set to $A_E$ and the peripheral length is set to $L_E$ and the emitter depth is set to $W_E$, $$P_E = \frac{J_{ce} \cdot L_E \cdot W_E}{J_{ci} \cdot A_E} = \frac{W_B}{L_n} \cdot \frac{L_E W_E}{A_E} \cdot \exp\left(\frac{-\Delta E_g}{kT}\right) \quad 2\text{-}(3)$$

It will be understood that the effect of exp $$\left(\frac{-\Delta E_g}{kT}\right)$$

is very large. As the emitter dimension decreases than 1 μm, the value of $$\frac{W_B}{L_n} \cdot \frac{L_E W_E}{A}$$

gradually approaches 1 and the effect of exp $$\left(\frac{-\Delta E_g}{kT}\right)$$

increases. On the other hand, to obtain exp $$\left(\frac{-\Delta E_g}{kT}\right) << 1,$$

it is sufficient to set such that $\Delta E_g >> kT$.

As mentioned above, in the case of the hetero bipolar transistor, the base current is the recombination current of the carriers which were implanted from the emitter.

As mentioned above, the recombination current includes the current in which the carriers are recombined in the first base region and the current in which the carriers are recombined at the periphery of the emitter.

The recombination current in the intrinsic base is as shown below.

$$J_{Bi} = \frac{1}{2} \frac{qD_n n_i^2 e^{\frac{\Delta E_g}{kT}}}{N_B} \frac{W_B}{L_n^2} \left\{ \exp\left(\frac{V_{BE}}{kT}\right) - 1 \right\} \quad 2\text{-}(4)$$

The recombination current $J_{Be}$ of the base at the v periphery is similar to the equation 2-(2). The ratio $P_B$ between the intrinsic base current in the base and the peripheral current is as shown below.

$$P_B = \frac{J_{Be} \cdot L_E \cdot W_E}{J_{Bi} \cdot A_E} = 2 \cdot \frac{L_n}{W_B} \cdot \frac{L_E W_E}{A_E} \cdot \exp\left(\frac{-\Delta E_g}{kT}\right) \quad 2\text{-}(5)$$

When the device is made fine, to keep the $h_{FE}$ of the BPT to a high value, $P_b << b$ must be set. Therefore, the condition of the following equation 2-(6) is important.

$$2 \frac{L_n}{W_B} \cdot \frac{L_E W_E}{A_E} << \exp\left(\frac{-\Delta E_g}{kT}\right) \quad 2\text{-}(6)$$

In generation, $L_n >> W_B$ and when the device is made fine, $$\frac{L_E W_E}{A_E} \approx 1,$$

so that the effect to shut out the current by the difference between the band gaps is very important.

The collector current is almost the same as that of the equation 2-(1) and $h_{FE}$ in the case of the BPT of the invention is as follows. $(1 + P_B \approx 1)$.

$$h_{FE} = \frac{J_c}{J_{Bi}} = 2 \left(\frac{L_n}{W_B}\right)^2 \quad 2\text{-}(7)$$

If the above effect is not obtained, $h_{FE}$ is set to $$\frac{1}{1 + P_B}.$$

The outline of the manufacturing processes of the semiconductor device shown in FIG. 14 will now be described with reference to FIG. 15.

Figure 15A:
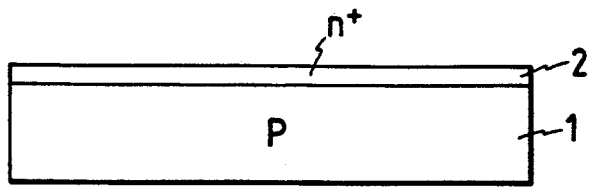
FIGS. 15A-15K show schematically process steps for producing the semiconductor device shown in FIG. 14.

1. By ion implanting As, Sb, P, or the like (or the ions may be also thermally diffused) into the p or n type substrate 1, the n+ buried region 2 of an impurity concentration of $1 \times 10^{16}$ to $1 \times 10^{19}$ cm$^{-3}$ is formed (FIG. 15A).

Figure 15B:
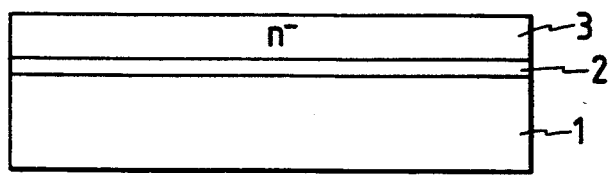

2. Then, the n region of an impurity concentration of $1 \times 10^{14}$ to $1 \times 10^{18}$ cm$^{-3}$ is formed by the epitaxial technique or the like (FIG. 15B).

Figure 15C:
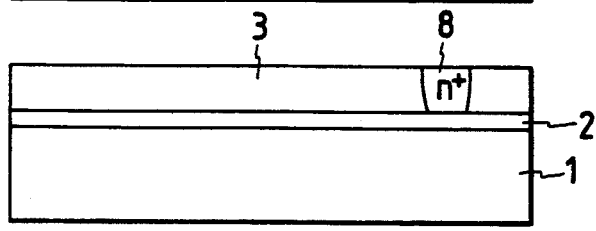

3. The n+ region 8 (impurity concentration: $1 \times 10^{17}$ to $1 \times 10^{20}$ cm$^{-3}$) to reduce the collector resistance is formed (FIG. 15C).

Figure 15D:
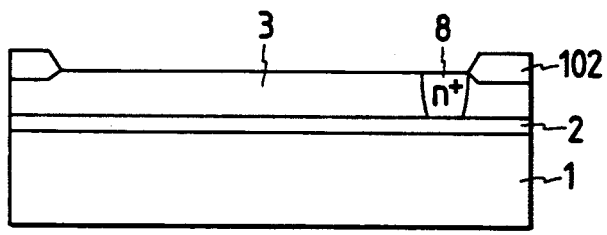

4. The element isolation region 102 is formed by the selective oxidation method, CVD method, or the like (FIG. 15D).

Figure 15E:
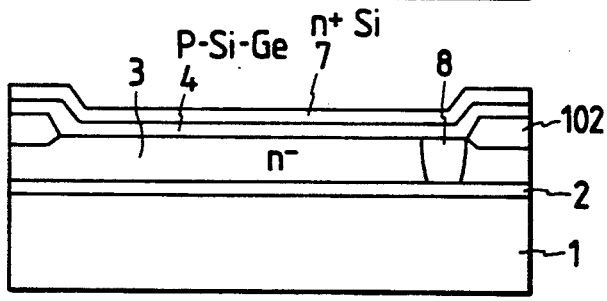

5. After the oxide film in the active region was eliminated, the narrow band gap layer ($Si_{1-x}Ge_x$ or the like) 4 serving as a base and the n+ layer 7 serving as an emitter are formed by the epitaxial method or the like (FIG. 15E).

Figure 15F:
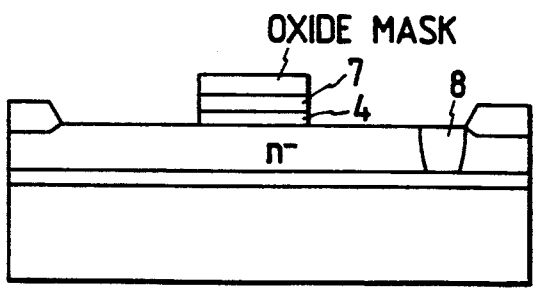

6. After the oxide film was deposited onto the whole surface, only the portions of the regions 7 and 4 serving as the emitter and base are left by the etching by using an oxide film as a mask. In this case, the etching is executed until a depth which is equal to or slightly deeper than the base. (FIG. 15F)

Figure 15G:
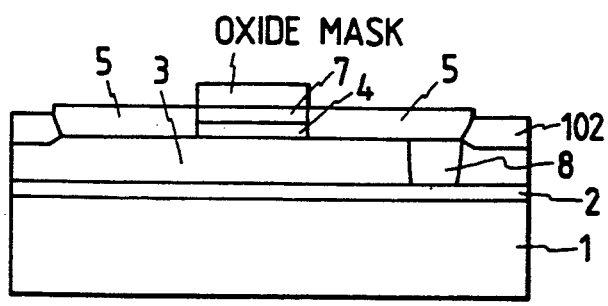

7. In a state in which the oxide film was left, the oxide film is used as a mask and the p type region 5 is formed on only Si in the etched crystal region by the selective epitaxial method (FIG. 15G).

Figure 15H:
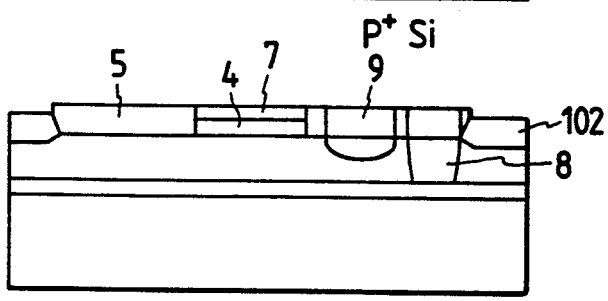

8. After the oxide film mask was removed, the p+ region 9 and collector region 8 to reduce the ohmic resistance of the base and the base resistance are formed and again diffused from the surface (FIG. 15H).

Figure 15I:
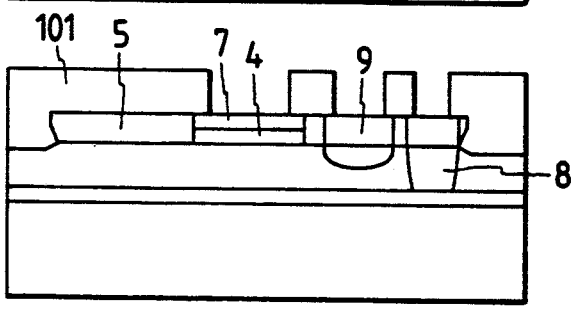

9. After the insulative material layer 101 was deposited, the contact hole is opened (FIG. 15I).

Figure 15J:
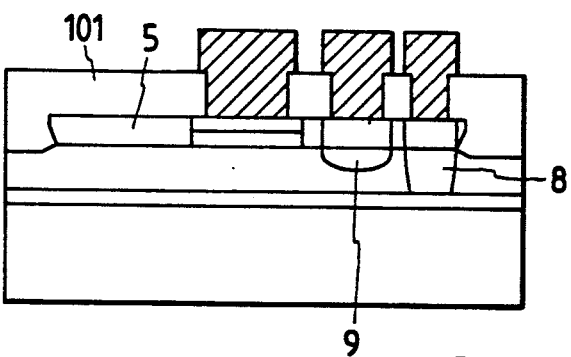

10. After the metal electrode 200 was deposited, it is patterned (FIG. 15J).

Figure 15K:
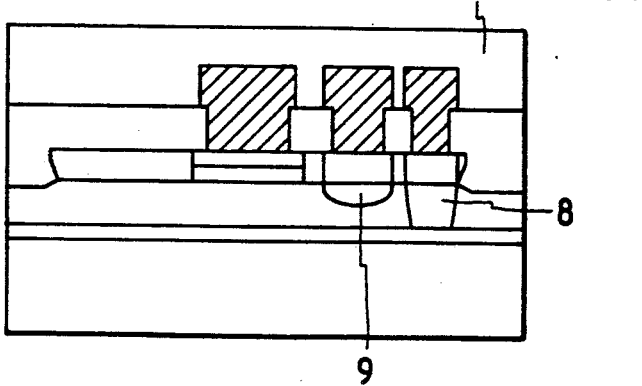

11. Finally, the product shown in FIG. 15J was annealed in the atmosphere at 400° C. for 30 minutes. Thereafter, the passivation film is formed, thereby completing the BPT. (FIG. 15K)

According to the above invention, the above described problems could be solved. And, above described object could be achieved.

(Embodiment 4)

Figure 16:
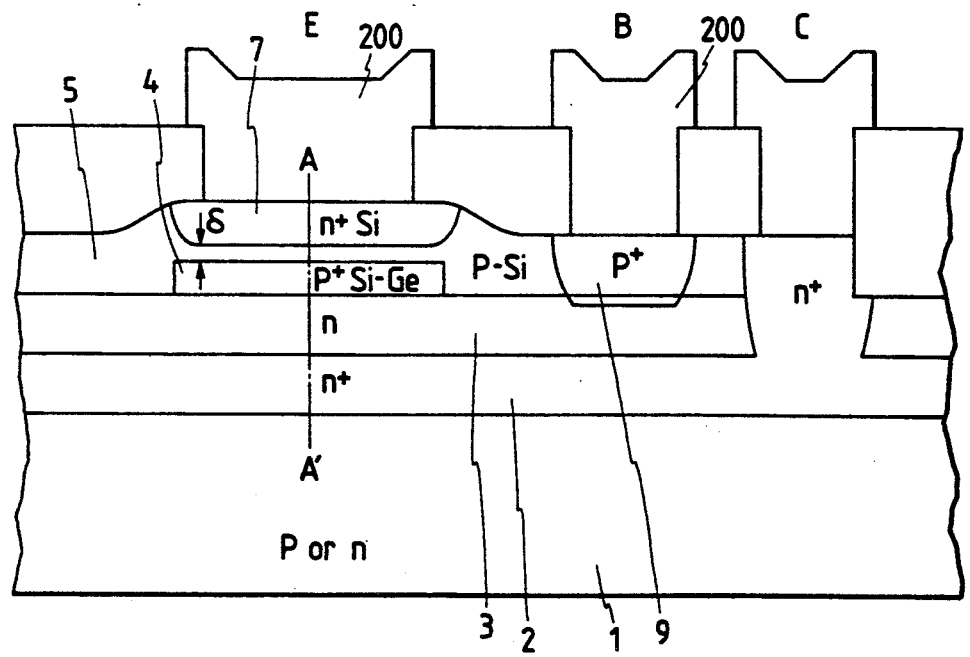
FIG. 16 is a schematic sectional view of another embodiment of the present invention.

FIG. 16 is a schematic cross sectional view showing another preferred embodiment of the invention. In the embodiment, a p+ $Si_{1-x}Ge_x$ layer is buried under the emitter region.

The manufacturing processes differ from FIG. 15. The p+ $Si_{1-x}Ge_x$ layer (base p+ region) 4 is formed by the epitaxial method. Then, the first base region is left and the remaining portions are etched and the second base region 5 is included and formed by the epitaxial method. After that, the emitter region 7 is formed by the diffusion (or ion implantation method). It is preferable to form the emitter region 7 so as to come into contact with the base p+ region 4. However, even if the emitter region does not reach the base p+ region 4 or even if the emitter region arrives at the base p+ region and enters the base, the effect of the concentration of the carriers from the emitter is similarly obtained. In FIG. 16, δ denotes an interval between the n+ Si region and the p+ $Si_{1-x}Ge_x$ region.

Figure 17A:
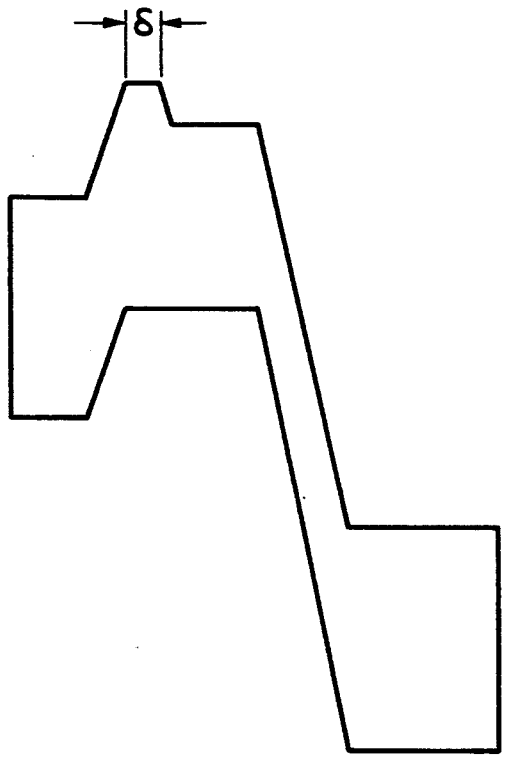
FIGS. 17A and 17B show potentials in a direction of depth of A—A' shown in FIG. 12.
Figure 17B:
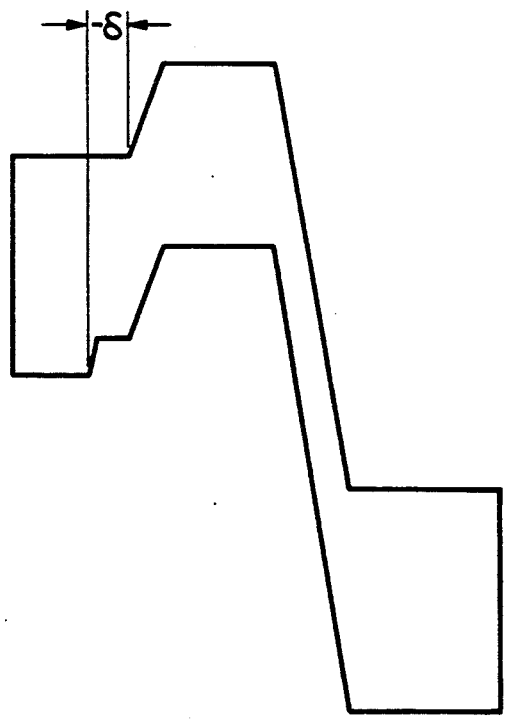

FIGS. 17A and 17B show potential distributions at the cross sectional surface A—A' in FIG. 16 with respect to the cases where the interval δ has a positive value (+) (that is, the case where the emitter region and the base p+ region are away from each other) and where it has a negative value (−), respectively.

When the interval δ is set to (+), the potential diagram as shown FIG. 17A is obtained. If the absolute value of the interval δ is smaller than the diffusion length $L_n$ of the minority carriers in the base, the hetero junction effect occurs and $h_{fe}$ increases. On the contrary, if the interval δ is set to (−), the potential diagram is as shown in FIG. 17B. If the absolute value of δ is smaller than the diffusion length $L_p$ of the minority carriers in the emitter, the hetero junction effect occurs and $h_{FE}$ increases. In any of the above cases, the collector current in the lateral direction in the base region in FIG. 16 can be sufficiently shut out by the band gap difference between Si and $Si_{1-x}Ge_x$.

According to the structure of the embodiment, controlling of producing steps would be made easier rather than burried structure. The producing steps would be simple. Accordingly, higher yielding and reduction in cost would be expected.

(Embodiment 5)

Figure 18:
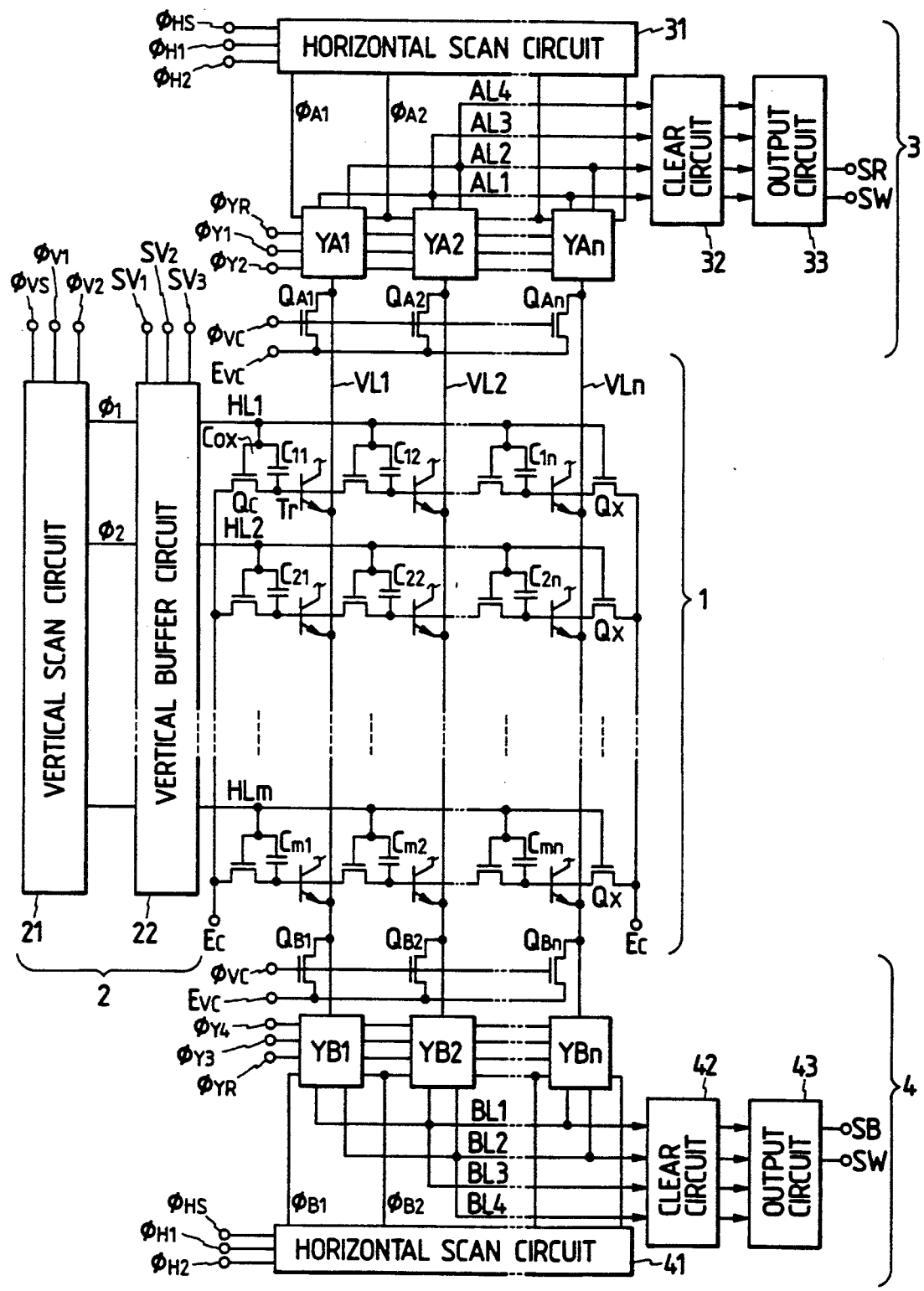
FIG. 18 shows a circuit diagram a solid-state image pick-up apparatus using BPT of the present invention.
Figure 19A:
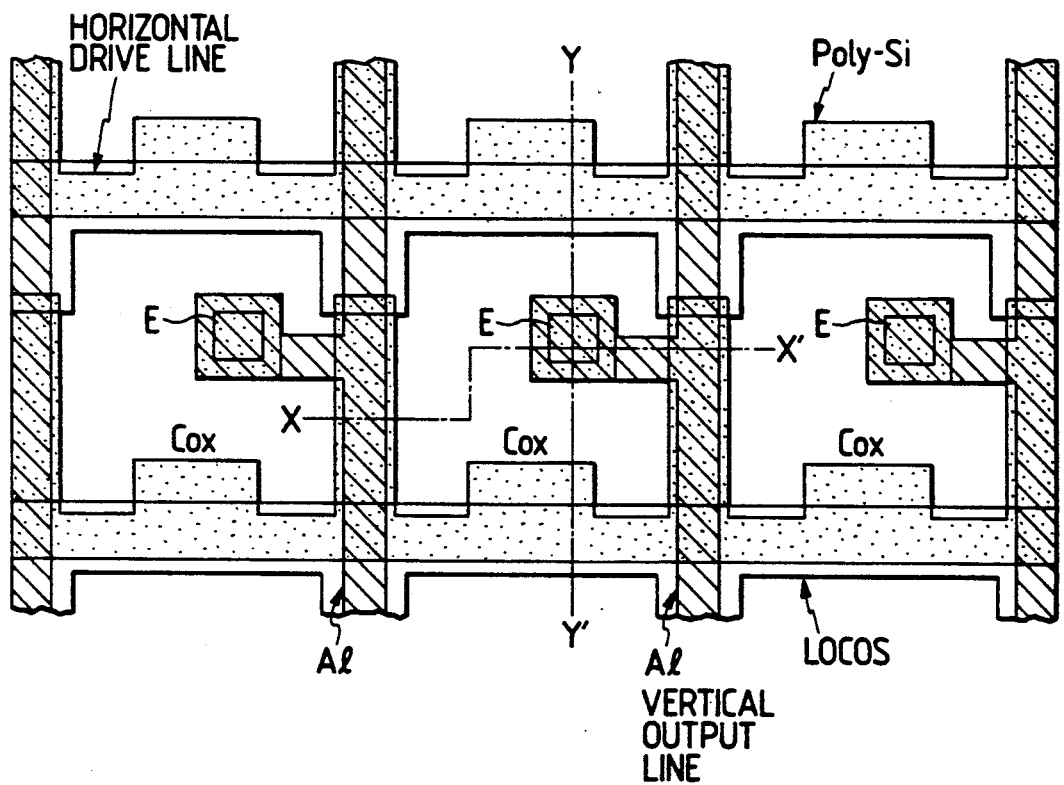
FIGS. 19A-19C show schematically plan view and sectional view of an image pick-up unit as shown in FIG. 18.
Figure 19B:
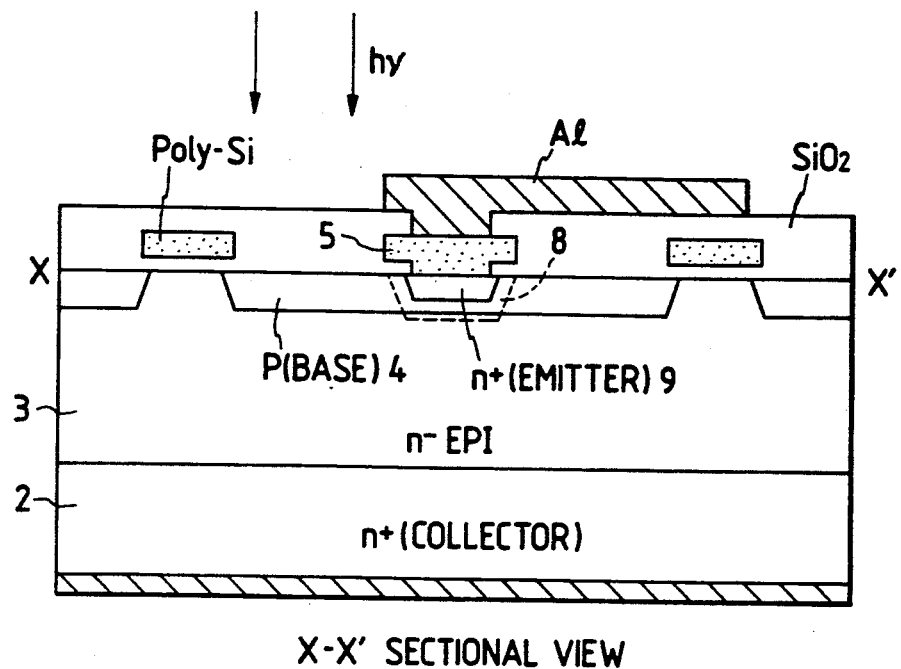
Figure 19C:
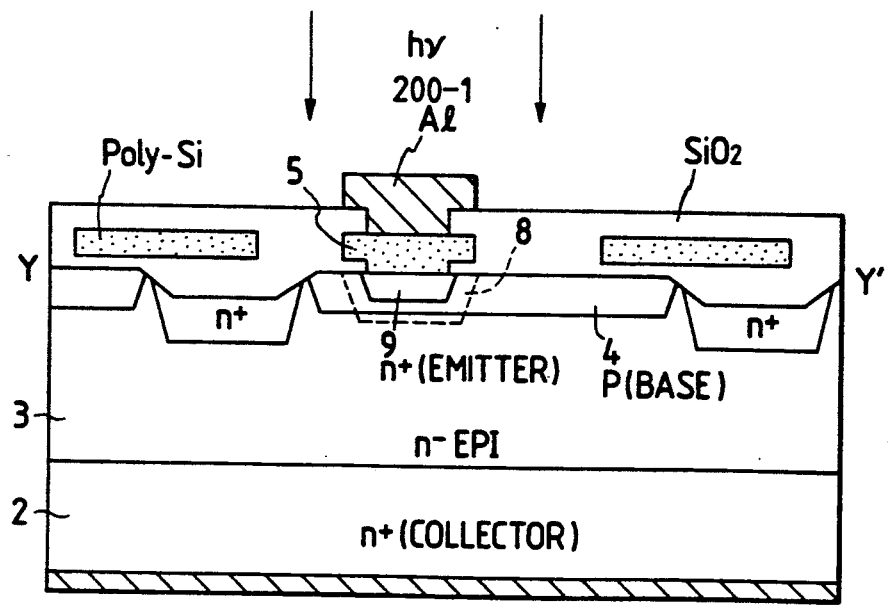

FIG. 18 is a circuit diagram showing the case where the BPT shown in the first embodiment is used in a photoelectric converting apparatus. In FIG. 18, the BPT shown in the embodiment 1 is sued in a portion indicated by Tr.

That is, in the embodiment, the BPT is used as a photoelectric converting element.

For instance, in the case of using an area sensor shown in FIG.. 18 as a color camera, the operation to read out light information of the same photoelectric converting element a plurality of times is executed. At this time, since the information is read out from the same element a plurality of times, there occurs a problem of the ration of electric outputs when the information is read out at the first time and when the information is read out at the second and subsequent times. When the ratio decreases, correction is necessary.

In FIG. 18, reference numeral 1 denotes an image pickup section; 2 indicates a vertical scan section, and 3 and 4 represent a vertical scan section and a read section.

FIG. 14 shows an actual plan view and a cross sectional view of the image pickup section.

The light enters from the upper portion and the holes are accumulated into the base.

If the ratio of the read outputs at the first and second reading operation times is defied as a nondestructive degree, it is expressed by the following equation.

$$Nondestructive\ degree = (C_{tot} \times h_{FE})/(C_{tot} \times h_{FE} + C_v)$$

$C_{tot}$ denotes a whole capacitance of capacitors connected to the base of the photoelectric converting element shown by Tr in FIG. 18 and is determined by a base-emitter capacitance $C_{be}$, a base-collector capacitance $C_{bc}$, and $C_{ox}$. $C_v$ denotes a stray capacitance of the reading lines shown by $VL_1, \ldots, VL_n$. There is also a case where $C_{ox}$ does not exit in dependence on a circuit system.

The nondestructive degree can be easily improved by increasing $h_{FE}$. That is, the nondestructive degree can be raised by increasing $h_{FE}$.

Although the embodiment has been described with respect to the case of the area sensor, the invention can be also obviously applied to a line sensor.

Even in the case of using the semiconductor device shown in FIG. 14, an excellent sensor which can nondestructively read out light information can be also similarly obtained.

I claim:

1. A semiconductor device comprising a collector region of a first conductivity type, a base region of a second conductivity type, opposite to the first conductivity type, and an emitter region of the first conductivity, wherein said base region has a first base area and a second base area provided surrounding said first base area, wherein a band gap width of said second base area is greater than that of said first base area, and wherein said first base area and said second base area are arranged adjacent respectively to said emitter region and said collector region.

2. A device according to claim 1, wherein
said emitter region has a band gap of substantially the same width as that of said second base area.

3. A device according to claim 1, further comprising a semiconductor region of the first conductivity type having substantially the same band gap width as that of said first base area.

4. A device according to claim 3, wherein said semiconductor region has a thickness no more than the minority carrier diffusion length.

5. A semiconductor device according to claim 1, wherein said second base region is connected to said collector region.

6. A device according to claim 1, wherein said emitter region has the same or substantially the same band gap width as that of said second base area.

7. A device according to claim 1, wherein said semiconductor region has a thickness of no more than the minority carrier diffusion length.

8. A device according to claim 1, wherein said first conductivity type is n-type.

9. A device according to claim 1, wherein said second conductivity type is p-type.

10. A device according to claim 1, wherein said first base area includes Si and Ge.

11. A device according to claim 1, wherein said collector region includes Si atoms.

12. A device according to claim 11, wherein said collector region is a single crystal.

13. A semiconductor device comprising:
a collector region of a first conductivity type;
a base region of a second conductivity type, opposite to the first conductivity type;
an emitter region of the first conductivity, wherein said base region has a first base area and a second base area provided around said first base area, and wherein a band gap width of said second base area is greater than that of said first base area; and
a semiconductor region having the same conductivity type as and the same band gap width as that of said second base area provided between said emitter region and said first base area.

14. A device according to claim 13, wherein said emitter region has the same or substantially the same band gap width as that of said second base area.

15. A device according to claim 13, wherein said semiconductor region has a thickness no more than the minority carrier diffusion length.

16. A device according to claim 13, wherein said first base area and said second base area are arranged adjacent respectively to said emitter region and said collector region.

17. A photoelectric conversion apparatus comprising:
a semiconductor device comprising a collector region of a first conductivity type, a base region of a second conductivity type, opposite to the first conductivity type and an emitter region of the first conductivity, wherein said base region ash a first base area and a second base area provided surrounding said first base area, wherein a band gap width of said second base area is greater than that of said first base area, and wherein said first base area and said second base area are arranged adjacent respectively to said emitter region and said collective region.

18. A semiconductor device comprising a collector region of a first conductivity type, a base region of a second conductivity type laminated on said collector region, and an emitter region of the first conductivity type formed on said base region, wherein at least a portion of said base region under said emitter region has a band gap smaller than that of said emitter and collector regions, and said base region has a horizontal potential barrier.

19. A semiconductor device according to claim 18, wherein said base region is connected to said collector region.

20. A photoelectric conversion apparatus comprising:
a semiconductor device comprising a collector region of a first conductivity type, a base region of a second conductivity type laminated on said collector region, and an emitter region of the first conductivity type disposed on said base region, wherein at least a portion of said base region under said emitter region has a band gap smaller than that of said emitter and collector regions, and wherein said base region has horizontal potential barrier.

* * * * *

UNITED STATES PATENT AND TRADEMARK OFFICE
CERTIFICATE OF CORRECTION

PATENT NO. : 5,140,400
DATED : August 18, 1992
INVENTOR(S) : MASAKAZU MORISHITA

It is certified that error appears in the above-identified patent and that said Letters Patent is hereby corrected as shown below:

COLUMN 3

Line 54, "record" should read --second--.

COLUMN 4

Line 18, "have" should read --base--.

COLUMN 7

Line 19, "$\Delta_E$" should read --$A_E$--.
Line 40, "$J_{Bx}/J_{By} \approx 2 (L_n W_B)$." should read --$J_{Bx}/J_{By} \approx 2 (L_n/W_B)$.--.

COLUMN 9

Line 25, "X=0.2," should read -- x=0.2,--.

COLUMN 12

Line 12, "$P_b<<b$" should read --$P_b<<1$--.

COLUMN 16

Line 12, "type" should read --type,--.
Line 13, "ash" should read --has--.

UNITED STATES PATENT AND TRADEMARK OFFICE
CERTIFICATE OF CORRECTION

PATENT NO. : 5,140,400
DATED : August 18, 1992
INVENTOR(S) : MASAKAZU MORISHITA

It is certified that error appears in the above-identified patent and that said Letters Patent is hereby corrected as shown below:

<u>COLUMN 16</u>

Line 19, "collective" should read --collector--.

Signed and Sealed this

Thirtieth Day of November, 1993

Attest:

BRUCE LEHMAN

Attesting Officer

Commissioner of Patents and Trademarks